(12) United States Patent
Iguchi

(10) Patent No.: US 7,149,092 B2
(45) Date of Patent: Dec. 12, 2006

(54) PRINTED CIRCUIT BOARD

(75) Inventor: Daisuke Iguchi, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 161 days.

(21) Appl. No.: 10/828,307

(22) Filed: Apr. 21, 2004

(65) Prior Publication Data

US 2004/0212971 A1 Oct. 28, 2004

(30) Foreign Application Priority Data

Apr. 24, 2003 (JP) .............................. 2003-119960

(51) Int. Cl.
*H05K 7/02* (2006.01)
*H05K 7/06* (2006.01)
*H05K 7/08* (2006.01)
*H05K 7/10* (2006.01)

(52) U.S. Cl. ...................... 361/780; 361/792; 361/794; 174/260; 174/264

(58) Field of Classification Search ........ 174/260–266; 361/792–795
See application file for complete search history.

(56) References Cited

U.S. PATENT DOCUMENTS

| | | | | |
|---|---|---|---|---|
| 5,374,788 A | * | 12/1994 | Endoh et al. ................ | 174/266 |
| 5,442,143 A | * | 8/1995 | Schmidt et al. ............. | 174/262 |
| 5,565,262 A | * | 10/1996 | Azzaro et al. .............. | 428/210 |
| 5,876,842 A | * | 3/1999 | Duffy et al. ................ | 428/209 |
| 6,617,526 B1 | * | 9/2003 | Miller ........................ | 174/261 |
| 6,937,120 B1 | * | 8/2005 | Fisher et al. ................ | 333/246 |

* cited by examiner

*Primary Examiner*—Elvin Enad
*Assistant Examiner*—Tuan Dinh
(74) *Attorney, Agent, or Firm*—Oliff & Berridge, PLC

(57) ABSTRACT

In a printed circuit board of the invention, a first signal wiring layer, a first ground layer, a second ground layer and a second signal wiring layer are laminated via an insulating material. A first signal wiring is formed on the first signal wiring layer and a second signal wiring is formed on the second signal wiring layer. The two signal wirings are connected via a first through hole. The conductive first ground layer and the conductive second ground layer are connected via a second through hole. The second through hole is insulated from the first through hole and formed so as to surround the first through hole.

18 Claims, 15 Drawing Sheets

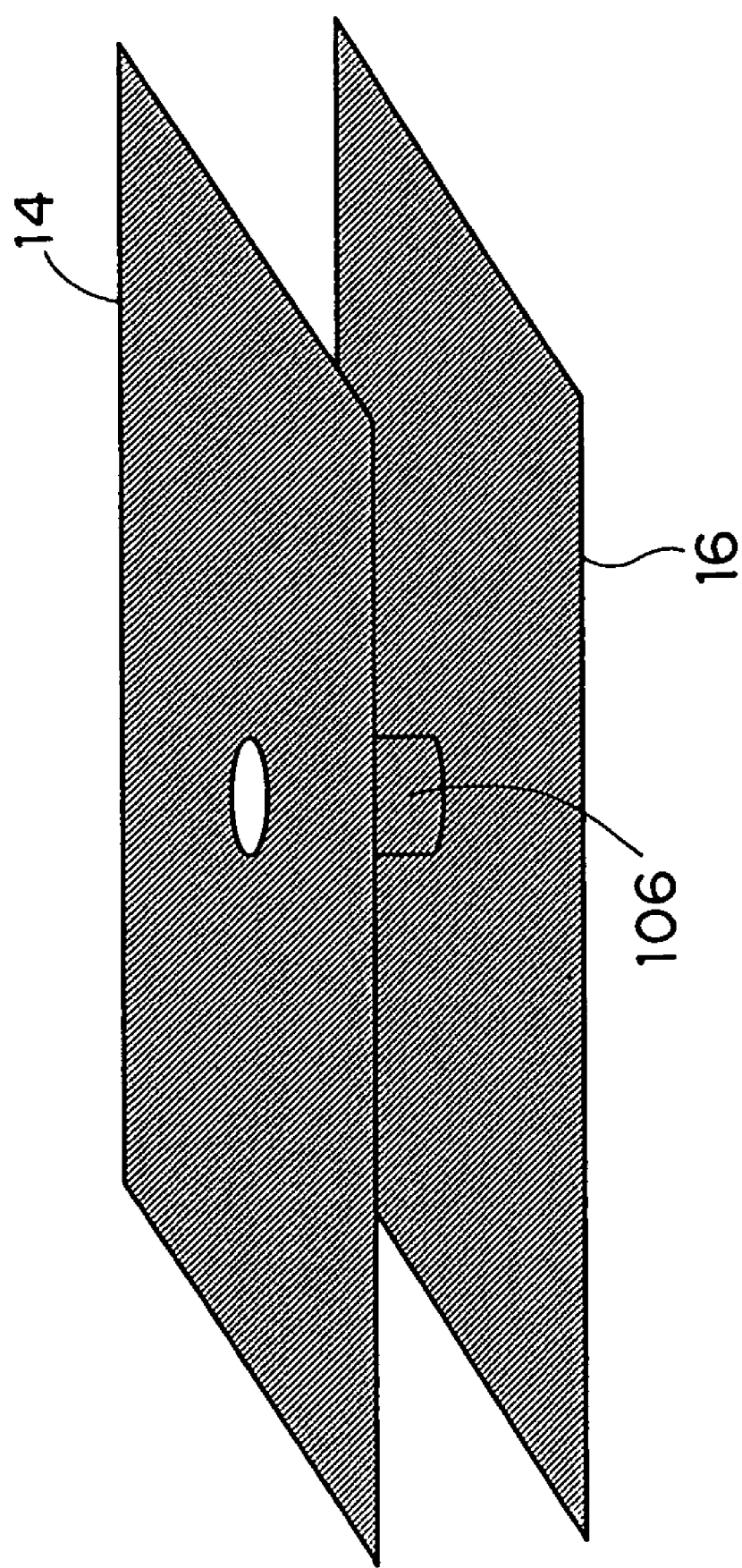

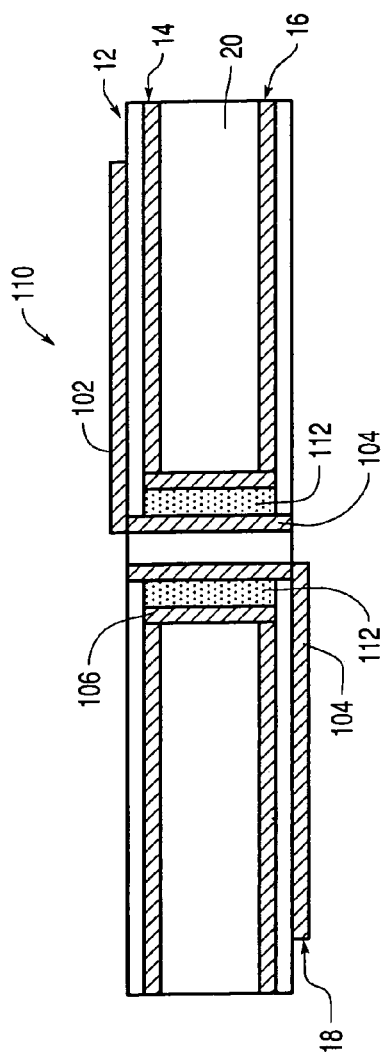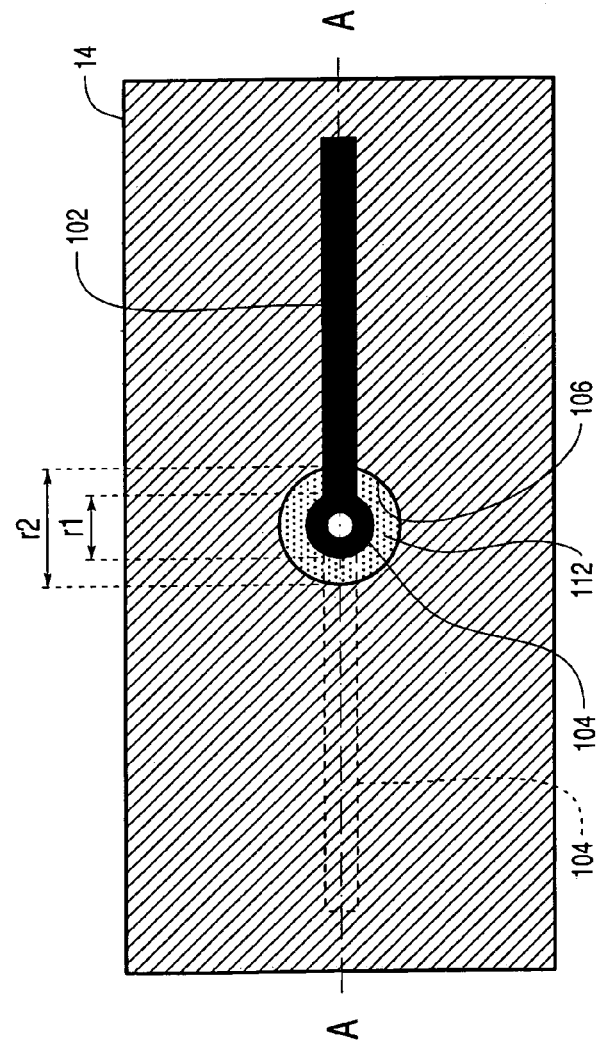
FIG. 4A
FIG. 4B

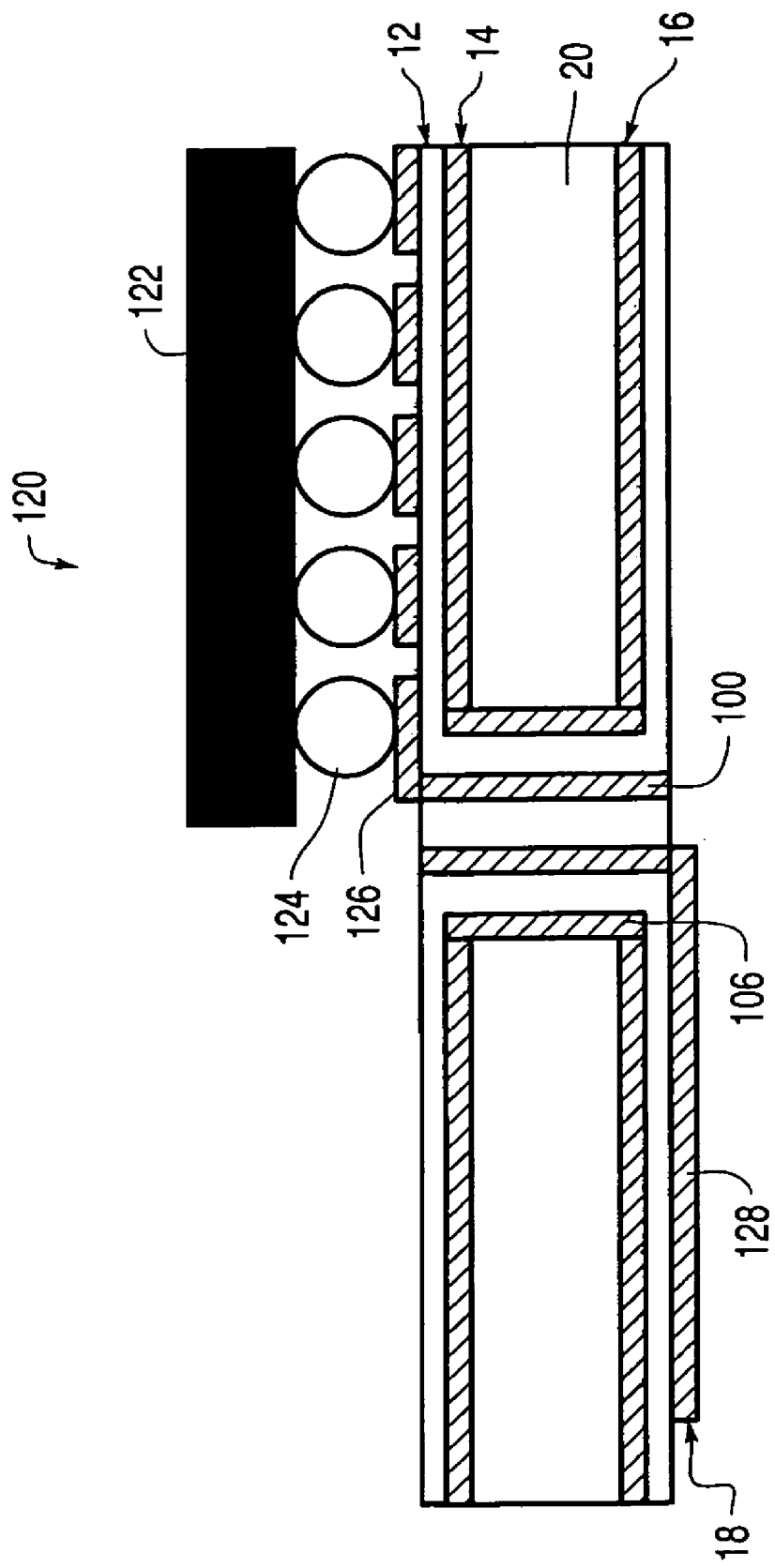

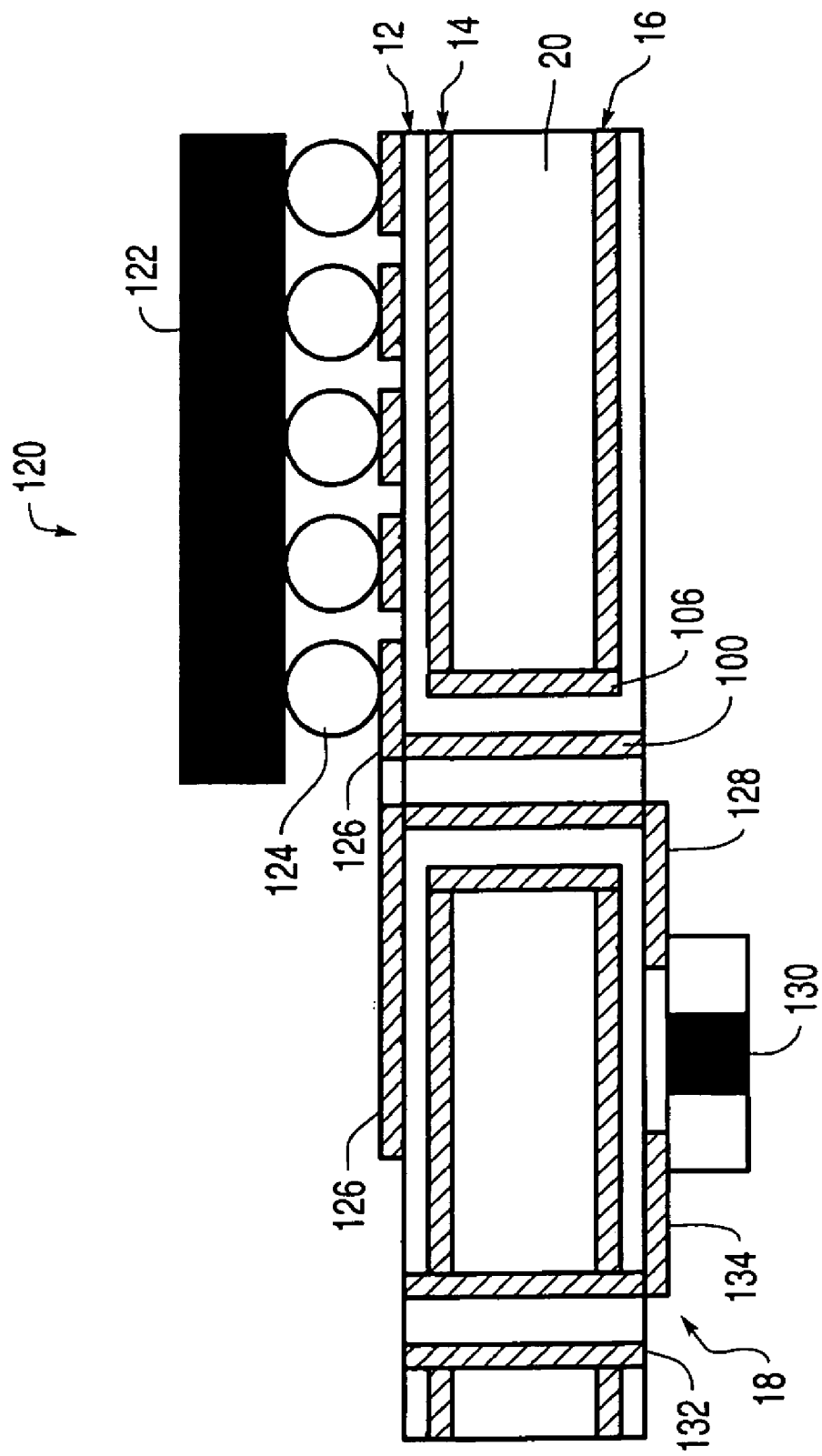

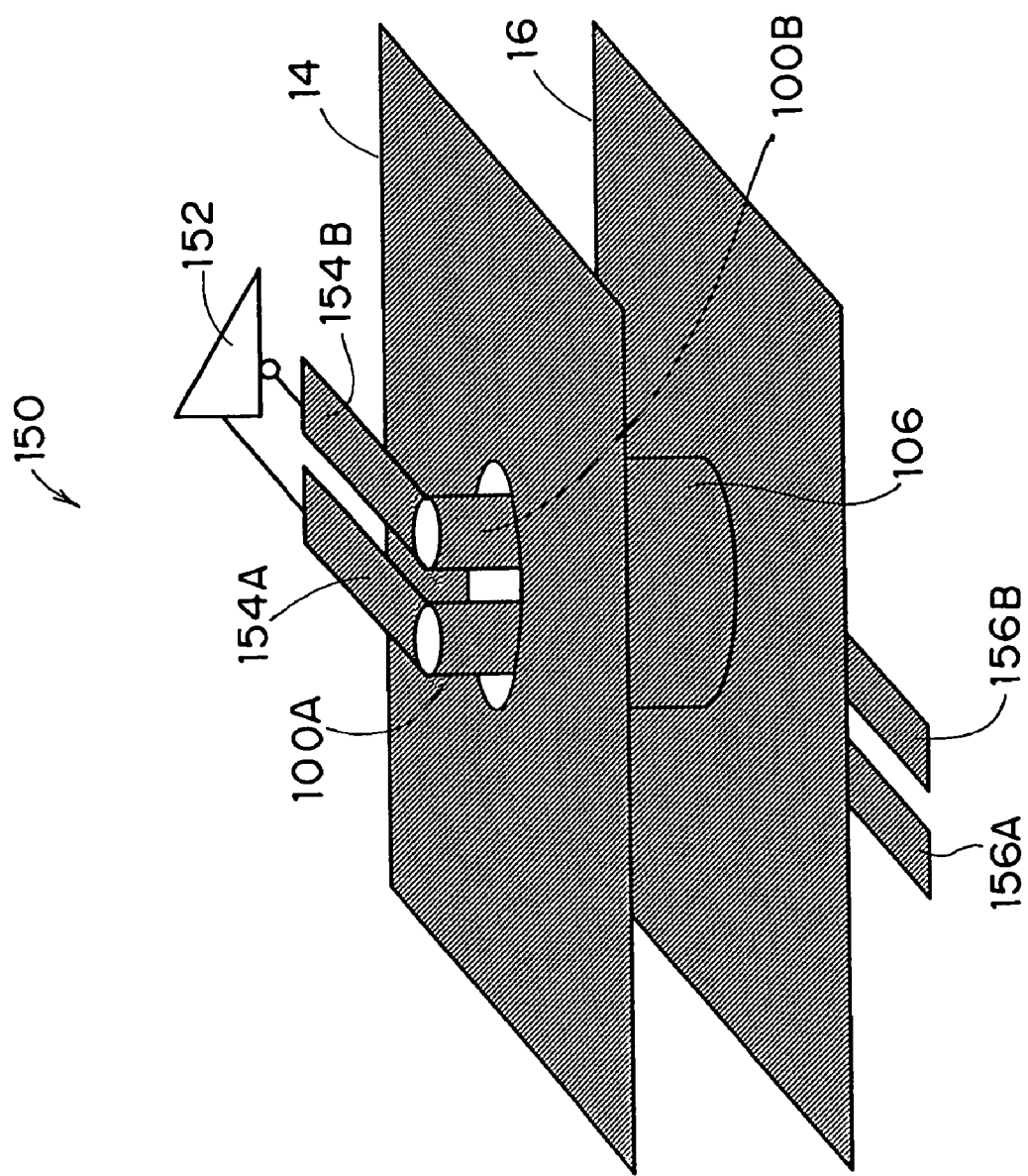

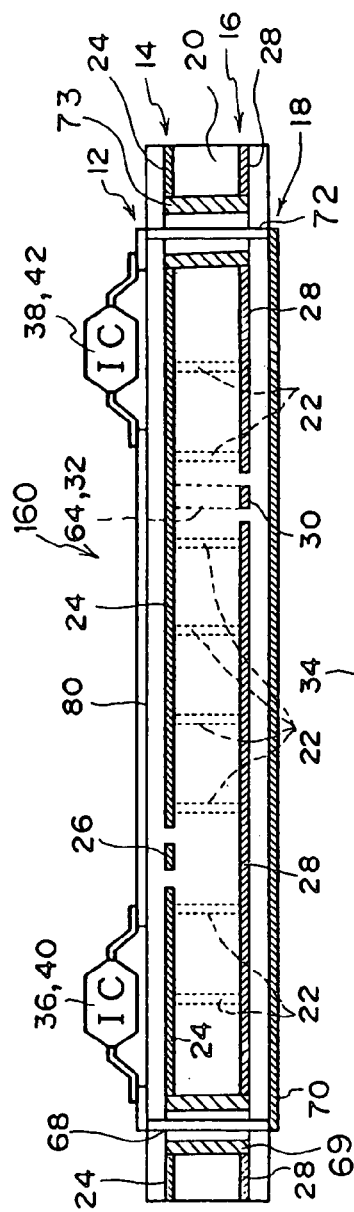
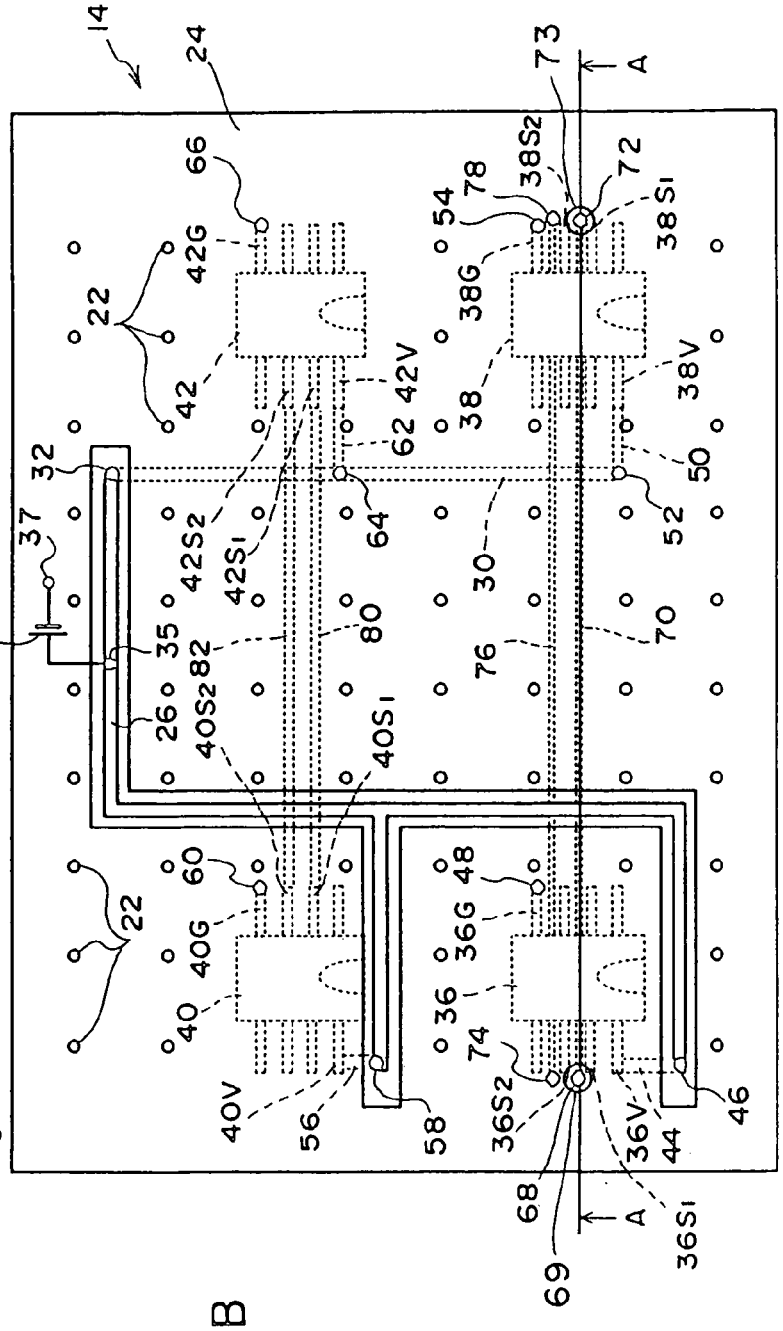
FIG.11A
FIG.11B

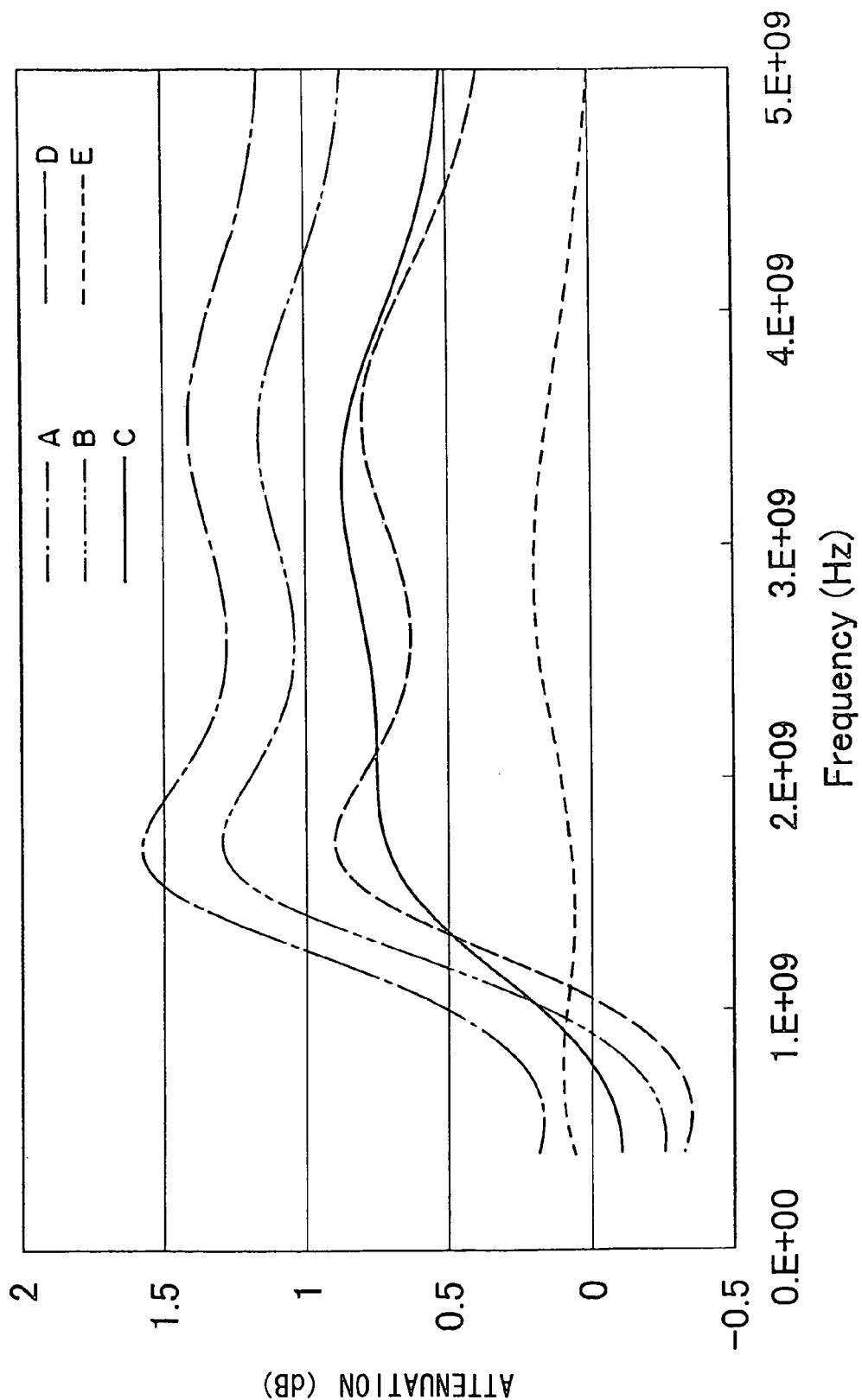

PRINTED CIRCUIT BOARD

CROSS-REFERENCE TO RELATED APPLICATION

This application claims priority under 35 USC 119 from Japanese Patent Application No. 2003-119960, the disclosures of which are incorporated by reference herein.

BACKGROUND OF THE INVENTION

1. Field of the Invention

The present invention relates to a printed circuit board, and in particular to a printed circuit board used in electronic devices such as, for example, personal computers, copiers, printers and fax machines.

2. Description of the Related Art

In order to transmit digital signals on printed circuit boards used in electronic devices, it is necessary to be able to sufficiently transmit digital signals with harmonic waves of ordinarily up to five times or greater with respect to the frequency of fundamental waves of a binary pulse. Namely, in order to transmit high-speed digital signals whose base clock is several hundred MHz or greater, consideration must be given to harmonic components of a GHz order.

It is known that dielectric loss and the skin effect impede the transmission of signals of a GHz order on a printed circuit board. Moreover, loss when the signals pass through plural layers through via holes for interconnecting different plural layers in a multilayer board also cannot be ignored.

According to the analyses of the present inventors, attenuation is particularly remarkable when the signals pass, through via holes, through plural layers such as a power layer and a ground layer sandwiched between two signal wiring layers. This is due to the following reasons.

Namely, in the transmission of signals in a printed circuit board, an apparent mirror current of the signal current flowing through the signal wirings flows symmetrically on reference surfaces such as the power layer and the ground layer adjacent to the signal wiring layers; in actuality, the return current distributively flows on the reference surfaces in accordance with the spread of electric power wires between the signal current and the mirror current. In a case where signal wirings wired to both sides of the printed circuit board are connected through via holes so as to penetrate plural reference surfaces, the signal current is impeded and attenuated when the return current cannot flow across these reference surfaces.

Also, when the return current cannot flow through the reference surfaces, a distant electromagnetic field is not cancelled due to the return current being incomplete. It has become apparent from the analyses of the present inventors that, in this case, common mode radiation arises.

It should be noted that signal attenuation becomes greater the smaller the connection between the two reference surfaces is. Namely, signal loss becomes greater the larger the interval between the two reference surfaces is.

Electromagnetic noise radiating from various types of electronic devices such as information devices, which has conventionally been a problem, is thought to result mainly from the signal wires of clock signals on the printed circuit board and digital signals synchronized with the clock signals. For this reason, various measures to prevent electromagnetic radiation have been adopted with respect to signal wires on the printed circuit board and wire harnesses connected to the signal wires.

For example, measures such as adding a damping resistor or filter to the signal output wires to take the edge off the rise and fall of the output signals, and disposing a guard pattern with a ground potential in the vicinity of the signal wires to make the return current loop smaller, have been widely and commonly conducted.

Also, among the electromagnetic waves observed in printed circuit boards, there are electromagnetic waves whose frequency distribution is different from that predicted from the current distribution on the signal wires and which have a sharp peak at a specific frequency without relation to the nature of the signal wires. It is known that the main cause of these electromagnetic waves lies in the electrical power system and not in the signal wires of the printed circuit board. Specifically, it lies in electrical resonance generated in the opposing power layer and ground layer.

As mentioned previously, when signals are transmitted at a high speed at a GHz order, loss when the signals pass through plural layers through via holes cannot be ignored. The affect of common mode radiation resulting from the return current being cut off is also large.

The present inventors analyzed the attenuation of signals traveling back and forth through two via holes in a case where the distance between two reference surfaces was 900 µm. As a result, it was revealed that 2.5 dB attenuation is likely to occur in signal components with a frequency of 2 GHz. In other words, it was understood that transmission of a GHz order in such a case is hardly practical.

In a printed circuit board of a structure where two ground layers are sandwiched between signal wiring layers, improvement can be made to a certain extent by disposing, in the vicinity of a signal-use via hole, a connection-use via hole for connecting plural ground layers to ensure that the return current flows through the plural ground layers. However, even in a case where a connection-use via hole is disposed in the vicinity of a signal-use via hole (e.g., a distance of 1.5 mm), the return current does not return in a GHz order and the effect of the improvement is small.

SUMMARY OF THE INVENTION

The present invention has been made in view of the above circumstances and provides a low-cost printed circuit board which can suppress electromagnetic radiation such as common mode radiation.

In order to achieve this object, a first aspect of the invention provides a printed circuit board where a first conductive layer and a second conductive layer forming conductive regions are respectively laminated, with an insulating layer intervened therebetween, between a first wiring layer and a second wiring layer for forming conductive wirings, the printed circuit board comprising: conductive first interlayer connecting member that is insulated from the first conductive layer and the second conductive layer and connects a first wiring of the first wiring layer and a second wiring of the second wiring layer; and conductive second interlayer connecting member that is connected to the conductive regions of the first conductive layer and the second conductive layer, is insulated from the first interlayer connecting member and surrounds the first interlayer connecting member.

According to this aspect, the first wiring of the first wiring layer and the second wiring of the second wiring layer are electrically connected by the first interlayer connecting member. Also, the periphery of the first interlayer connecting member is surrounded by the second interlayer connecting member connected to the conductive regions of the first conductive layer and the second conductive layer.

Additionally, the first interlayer connecting member is insulated from the first conductive layer and second conductive layer, and the second interlayer connecting member is insulated from the first interlayer connecting member. In this aspect, a transmission path of a coaxial structure is formed by the first interlayer connecting member and the second interlayer connecting member, and the periphery of the first interlayer connecting member is made to have the same potential by the second interlayer connecting member.

For this reason, even in cases where a signal is transmitted or power is supplied from the first wiring of the first wiring layer to the second wiring of the second wiring layer via the first interlayer connecting member, deterioration in the transmission characteristics of the signal in the case where a signal is transmitted across plural layers, and the generation of electromagnetic radiation, which have conventionally been problems, can be suppressed.

In a second aspect of the invention, the first conductive layer and the second conductive layer respectively include plural conductive regions of different potentials, with the second interlayer connecting member connecting conductive regions of substantially the same potential of the first conductive layer and the second conductive layer.

According to this aspect, the first conductive layer and the second conductive layer can be respectively provided with plural conductive regions of different potentials.

For example, as a third aspect of the invention, the plural conductive regions may be configured to include a power region and a ground region.

According to the second and third aspects, a power region and a ground region can be mixed in a single conductive layer so that the degree of design freedom can be improved.

In a fourth aspect of the invention, the characteristic impedance relating to the first interlayer connecting member and the second interlayer connecting member, the characteristic impedances of the first wiring and the characteristic impedances of the second wiring are substantially identical.

According to this aspect, the characteristic impedance relating to the transmission path of the coaxial structure comprising the first interlayer connecting member and the second interlayer connecting member and the characteristic impedance relating to the first wiring and the second wiring are substantially identical. Thus, deterioration in signal quality resulting from signal reflection and electromagnetic radiation resulting from standing waves can be suppressed.

A fifth aspect of the invention, at least one of an outer diameter of the first interlayer connecting member and an inner diameter of the second interlayer connecting member is adjusted so that the characteristic impedance relating to the first interlayer connecting member and the second interlayer connecting member, the characteristic impedances of the first wiring and the characteristic impedances of the second wiring are substantially identical. Thus, the respective characteristic impedances can be made substantially identical.

Alternatively, as a sixth aspect of the invention, the printed circuit board may further include a dielectric member between the first interlayer connecting member and the second interlayer connecting member, wherein the dielectric constant of the dielectric member is adjusted so that the characteristic impedance relating to the first interlayer connecting member and the second interlayer connecting member, and the characteristic impedances of the first wiring and the characteristic impedances of the second wiring are substantially identical. According to this aspect also, the respective characteristic impedances can be made substantially identical.

As a seventh aspect of the invention, the first wiring and the second wiring may be signal wires for signal transmission.

Alternatively, as an eighth aspect of the invention, the first wiring and the second wiring may be power wires for power supply.

In a ninth aspect of the invention, a power terminal of an active device is connected to one of the first wiring and the second wiring, one end of a condenser is connected to the other of the first wiring and the second wiring, and the other end of the condenser is connected to a ground region disposed on at least one of the first conductive layer and the second conductive layer via third interlayer connecting member.

According to this aspect, an active device and a decoupling-use condenser are disposed on different wiring layers. Namely, the power terminal of the active device and the condenser are connected via the first interlayer connecting member. Thus, the supply characteristics of a transient current from the condenser can be improved.

In a tenth aspect of the invention, the dielectric constant between the first interlayer connecting member and the second interlayer connecting member is higher than the dielectric constant between the first conductive layer and the second conductive layer.

According to this aspect, the dielectric constant between the first interlayer connecting member and the second interlayer connecting member is higher than the dielectric constant between the first conductive layer and the second conductive layer. For this reason, the transmission path itself of the coaxial structure comprising the first interlayer connecting member and the second interlayer connecting member has a capacitance, and the supply characteristics of the transient current can be improved.

In an eleventh aspect of the invention, the first wiring is configured by a pair of first differential signal wirings for differential signals, the second wiring is configured by a pair of second differential signal wirings for the differential signals, and a pair of the first interlayer connecting members respectively connecting one of the pair of first differential signal wirings with one of the pair of second differential signal wirings and the other of the pair of first differential signal wirings with the other of the pair of second differential signal wirings is surrounded by the second interlayer connecting member.

According to this aspect, the pair of first interlayer connecting members connecting to the pair of first differential signal-use wirings and the pair of second differential signal-use wirings is surrounded by the second interlayer connecting member, whereby common mode impedance is prevented from becoming discontinuous. Thus, electromagnetic radiation resulting from a common mode current induced by the common mode impedance becoming discontinuous can be prevented from increasing. Also, deterioration in the transmission characteristics of a differential signal resulting from the return current being cut off can be prevented.

In the eleventh aspect, it is preferable for the differential impedances of the first interlayer connecting members to be substantially identical to the differential impedances of the first differential signal wirings and the second differential signal wirings (twelfth aspect of the invention). In such a state, the transmission characteristics of the differential signals can further be improved.

In a thirteenth aspect of the invention, it is preferable for the common mode impedances of the pair of first interlayer connecting members with respect to the ground regions of the first conductive layer and the second conductive layer to be substantially identical to at least one of the common mode impedances of the pair of first differential signal wirings with respect to the ground regions and the common mode impedances of the pair of second differential signal wirings with respect to the ground regions. Thus, an increase in electromagnetic radiation resulting from a common mode current can be more effectively prevented.

A fourteenth aspect of the invention provides a printed circuit board where a wiring layer for forming a conductive wiring and a first conductive layer and a second conductive layer forming conductive regions are respectively laminated with an insulating layer intervened therebetween, the printed circuit board including: conductive first interlayer connecting member that is insulated from the first conductive layer and the second conductive layer and is connected to the wiring of the wiring layer; and conductive second interlayer connecting member that is connected to the conductive regions of the first conductive layer and the second conductive layer, is insulated from the first interlayer connecting member and surrounds the first interlayer connecting member.

According to this aspect, the first interlayer connecting member is electrically connected to the wiring of the wiring layer. Also, the periphery of the first interlayer connecting member is surrounded by the second interlayer connecting member connected to the first conductive layer and the second conductive layer.

Additionally, the first interlayer connecting member is insulated from the first conductive layer and second conductive layer, and the second interlayer connecting member is insulated from the first interlayer connecting member. In this aspect, a transmission path of a coaxial structure is formed by the first interlayer connecting member and the second interlayer connecting member, and the periphery of the first interlayer connecting member is made to have the same potential by the second interlayer connecting member.

For this reason, in a case where, for example, an active device is disposed on a layer opposite from the wiring layer and a terminal of the active device is connected to the wiring of the wiring layer through the first interlayer connecting member, when a signal is transmitted or when power is supplied from the wiring of the wiring layer to the terminal of the active device, deterioration in the transmission characteristics of the signal in the case where a signal is transmitted across plural layers, and the generation of electromagnetic radiation, which have conventionally been problems, can reliably be suppressed.

Also, in a case where the first interlayer connecting member is positioned midway of the wiring of the wiring layer, it is also possible to use the sturucture as a filter varying the signal characteristics because impedance changes at the positions of the first interlayer connecting member and the second interlayer connecting member.

In a fifteenth aspect of the invention, the characteristic impedance of the first interlayer connecting member and the second interlayer connecting member based on the fourteenth aspect is set to a predetermined impedance.

According to this aspect, because the characteristic impedance relating to the first interlayer connecting member and the second interlayer connecting member is set to an impedance predetermined according to purpose, it is also possible to use the structure as a filter varying the signal characteristics.

It should be noted that the characteristic impedance relating to the first interlayer connecting member and the second interlayer connecting member based on the fourteenth aspect can be set to a desired characteristic impedance by adjusting at least one of the outer diameter of the first interlayer connecting member, an inner diameter of the second interlayer connecting member and the dielectric constant between the first interlayer connecting member and the second interlayer connecting member.

BRIEF DESCRIPTION OF THE DRAWINGS

FIG. 2 is a perspective view of a first ground layer and a second ground layer of the printed circuit board according to the first embodiment.

FIG. 4B is a schematic plan view of a printed circuit board according to a second embodiment of the invention, and FIG. 4A is a cross-sectional view of the same printed circuit board along line A—A of FIG. 4B.

FIG. 5 is a cross-sectional view of a printed circuit board according to a third embodiment of the invention.

FIG. 6 is a cross-sectional view of a printed circuit board according to a modified example of the third embodiment.

FIG. 10 is a perspective view of a portion of a printed circuit board according to a fourth embodiment of the invention.

FIG. 11B is a schematic plan view of a printed circuit board according to a fifth embodiment of the invention, and FIG. 11A is a cross-sectional view of the same printed circuit board along line A—A of FIG. 11B.

FIG. 12 is a graph showing results where the relation between the attenuation and frequencies of signals in printed circuit boards of the Examples is simulated.

DESCRIPTION OF THE PREFERRED EMBODIMENTS

A first embodiment of the invention will be described below.

Figure 1A:
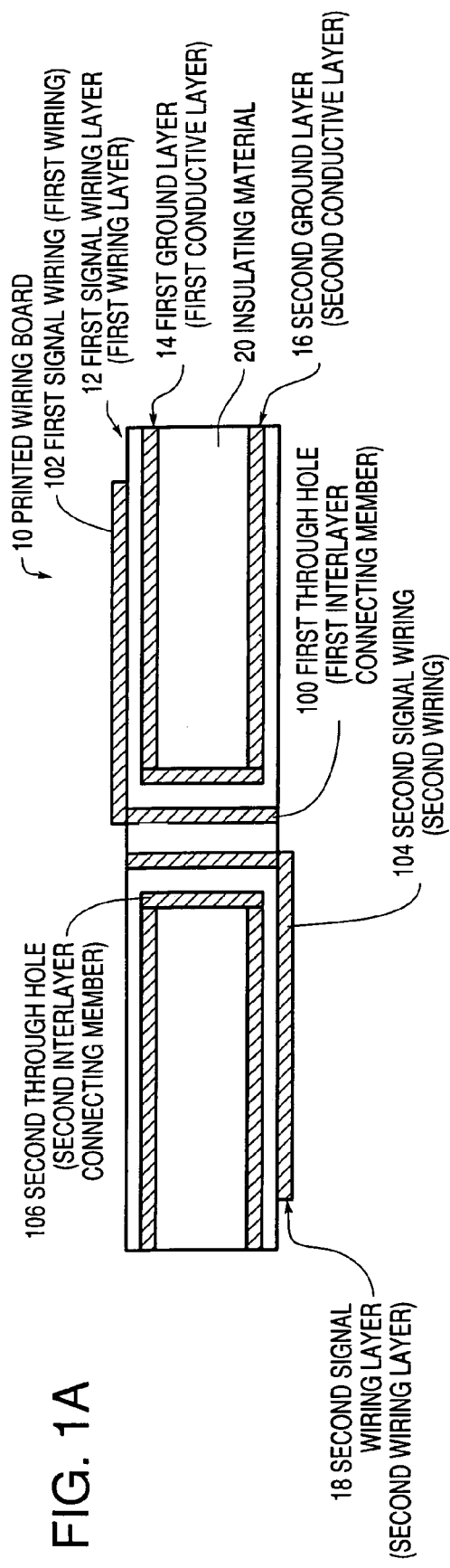
FIG. 1A is a cross-sectional view of the same printed circuit board along line A—A of FIG. 1B.

FIG. 1A shows a schematic cross-sectional view of a printed circuit board 10 according to the present embodiment. As shown in FIG. 1A, the printed circuit board 10 includes a 4-layer board of a multilayer structure where a first signal wiring layer 12, a first ground layer 14, a second ground layer 16 and a second signal wiring layer 18 are laminated via an insulating material 20.

Figure 1B:
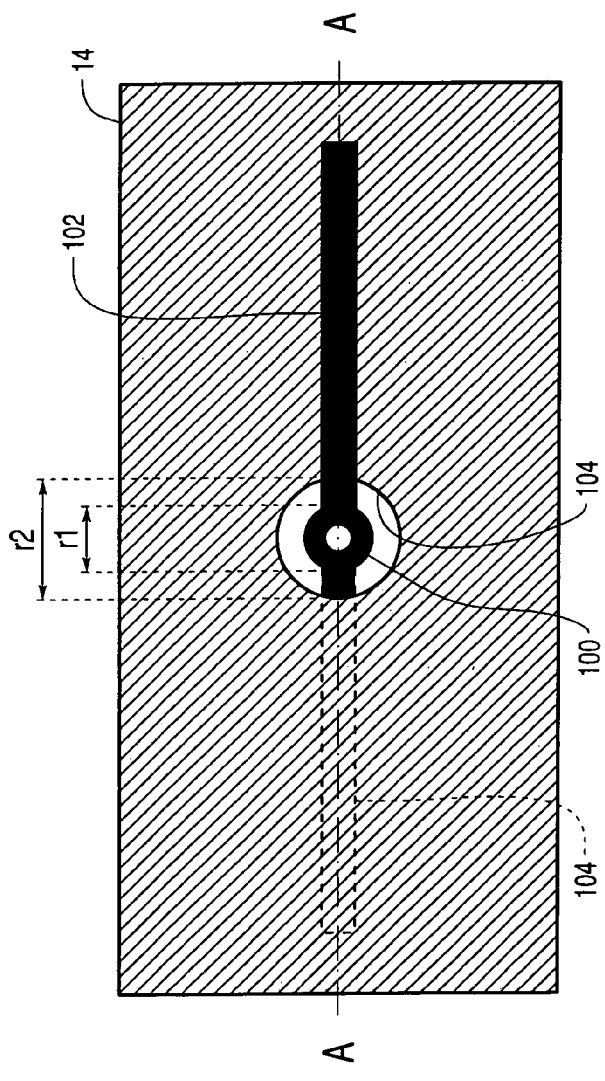
FIG. 1B is a schematic plan view of a printed circuit board according to a first embodiment of the invention.

FIG. 1B shows a plan view of the first ground layer 14. It should be noted that the insulating material 20 is omitted for ease of description. Also, FIG. 1A is a cross-sectional view along line A—A of FIG. 1B.

As shown in FIG. 1A, a cylindrical conductive first through hole 100 is disposed in the printed circuit board 10. A conductive first signal wiring 102 is formed on the first signal wiring layer 12 and a conductive second signal wiring 104 is formed on the second signal wiring layer 18. The signal wiring 102 and the signal wiring 104 are connected (so as to be conductive) via the first through hole 100.

As shown in FIG. 2, the conductive first ground layer 14 and the conductive second ground layer 16 are connected via a cylindrical conductive second through hole 106. Thus, the first ground layer 14 and the second ground layer 16 have substantially the same potential (ground potential).

The second through hole 106 is isolated from the first through hole 100 and formed so as to surround the first through hole 100. Namely, the first through hole 100 and the second through hole 106 have a coaxial structure to form a structure where the first through hole 100 is disposed inside the second through hole 106.

Figure 14A:
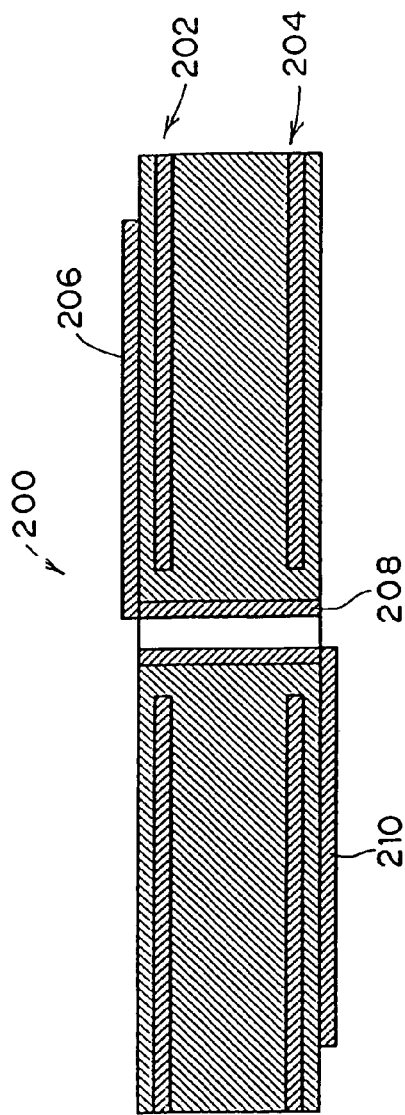
FIG. 14A is a cross-sectional view of the same conventional printed circuit board along line A—A of FIG. 14B.
Figure 14B:
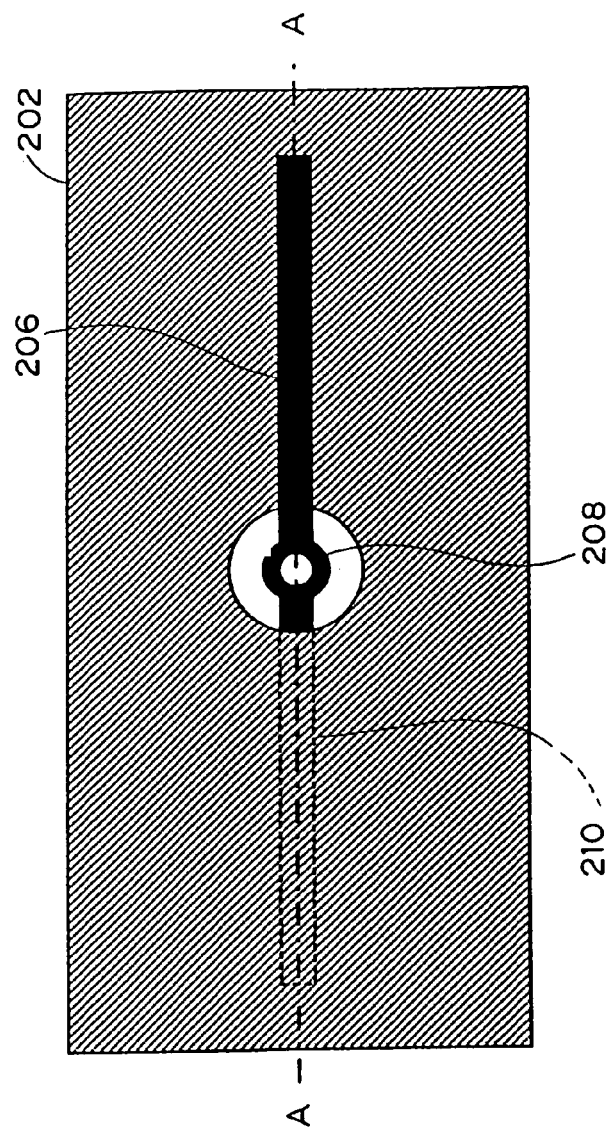
FIG. 14B is a schematic plan view of a conventional printed circuit board.
Figure 15:
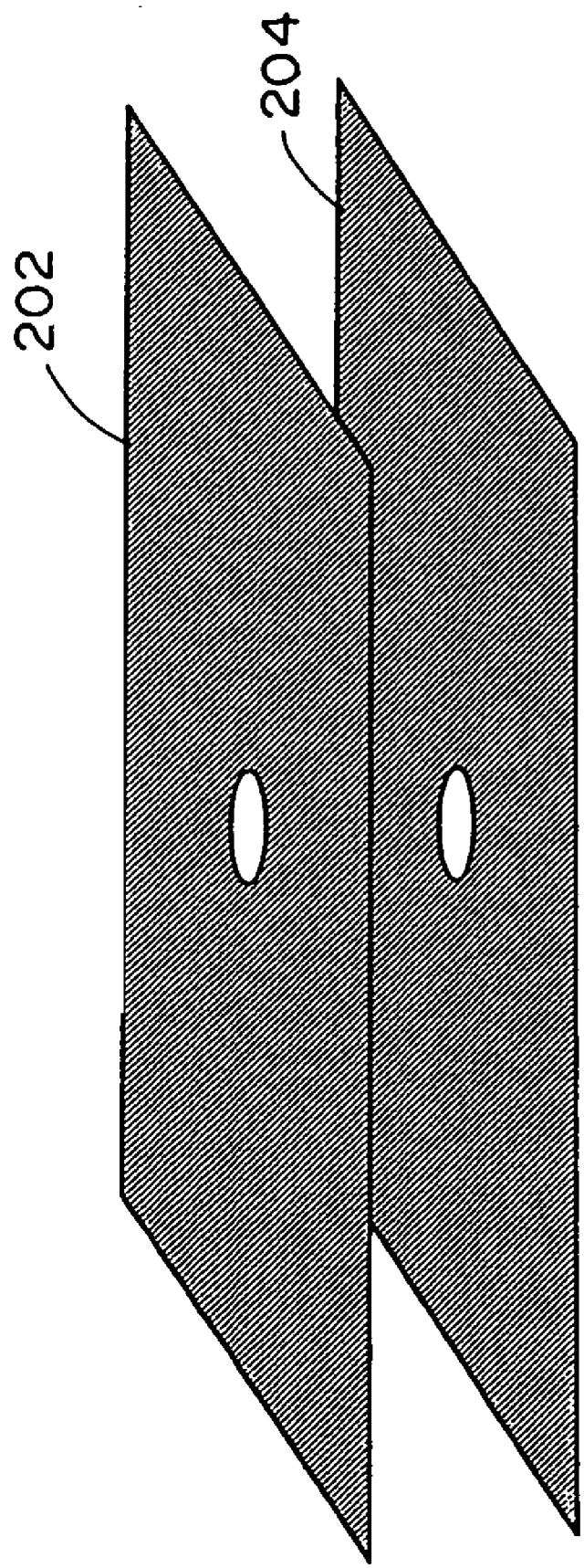
FIG. 15 is a perspective view of a first ground layer and a second ground layer of the conventional printed circuit board.

In a case where a first ground layer 202 and a second ground layer 204 are not connected as in a conventional printed circuit board 200 shown in FIGS. 14A, 14B and 15, the return current is cut off when the signal flowing through a signal wiring 206 flows across the first ground layer 202 and the second ground layer 204 by way of a first through hole 208, to a signal wiring 210.

As a result, signal transmission characteristics deteriorate, particularly in a GHz order, the signal is attenuated due to the signal flowing across the first ground layer 202 and the second ground layer 204, and electromagnetic radiation resulting from a common mode current induced by the return current being cut off is generated.

In contrast, in the printed circuit board 10 according to the present embodiment, the first ground layer 14 and the second ground layer 16 are connected by the second through hole 106, and the second through hole 106 is configured to surround the first through hole 100. For this reason, the return current can be prevented from being cut off, the signal can be prevented from being attenuated, even if the signal is of a GHz order, and electromagnetic radiation resulting from the common mode current can be suppressed.

Incidentally, by varying an outer diameter r1 of the first through hole 100 and an inner diameter r2 of the second through hole 106, a characteristic impedance Z relating to the transmission path of the coaxial structure comprising the first through hole 100 and the second through hole 106 can be controlled. The characteristic impedance Z is represented by the following equation.

[Equation 1]

$$Z = \frac{1}{2}\pi \times \sqrt{\frac{\mu}{\varepsilon}} \times \ln\left(\frac{r2}{r1}\right) \quad (1)$$

Here, $\mu$ represents the permeability of the insulating material 20 between the first through hole 100 and the second through hole 106, and $\varepsilon$ represents the dielectric constant of the insulating material 20 between the first through hole 100 and the second through hole 106.

Namely, in a case where the permeability $\mu$ and the dielectric constant $\varepsilon$ are constant, the characteristic impedance relating to the first through hole 100 and the second through hole 106 are dependent on the outer diameter r1 of the first through hole 100 and the inner diameter r2 of the second through hole 106.

Thus, it is preferable to set the outer diameter r1 of the first through hole 100 and the inner diameter r2 of the second through hole 106 so that the characteristic impedance relating to the first through hole 100 and the second through hole 106 substantially matches a characteristic impedances predetermined from the input/output characteristics of the first signal wiring 102, the second signal wiring 104 and devices connected to these signal wirings.

As is apparent from the above equation (1), the outer diameter r1 of the first through hole 100 may be reduced or the inner diameter r2 of the second through hole 106 may be enlarged when one wishes to raise the characteristic impedance Z, and the outer diameter r1 of the first through hole 100 may be enlarged or the inner diameter r2 of the second through hole 106 may be reduced when one wishes to lower the characteristic impedance Z.

In this manner, by adjusting at least one of the outer diameter r1 of the first through hole 100 and the inner diameter r2 of the second through hole 106 so that the characteristic impedance relating thereto matches the impedance of the signal transmission path, deterioration of signal quality resulting from signal reflection can be further suppressed, even with a signal of a GHz order.

In the present embodiment, the second through hole 106 has a structure that completely surrounds the first through hole 100 at a region where the first through hole 100 passes by the first ground layer 14 and the second ground layer 16; however, the second through hole 106 may also open in a mesh shape, i.e., may open partially. In this case, it is necessary to sufficiently reduce the length of the open portion with respect to the wavelength of the signal flowing through the first through hole 100.

Also, in the present embodiment, the first ground layer 14 and the second ground layer 16 are configured by ground regions that both have ground potentials; however, they may also be configured so that plural regions with different potentials are formed in a single layer.

Figure 3A:
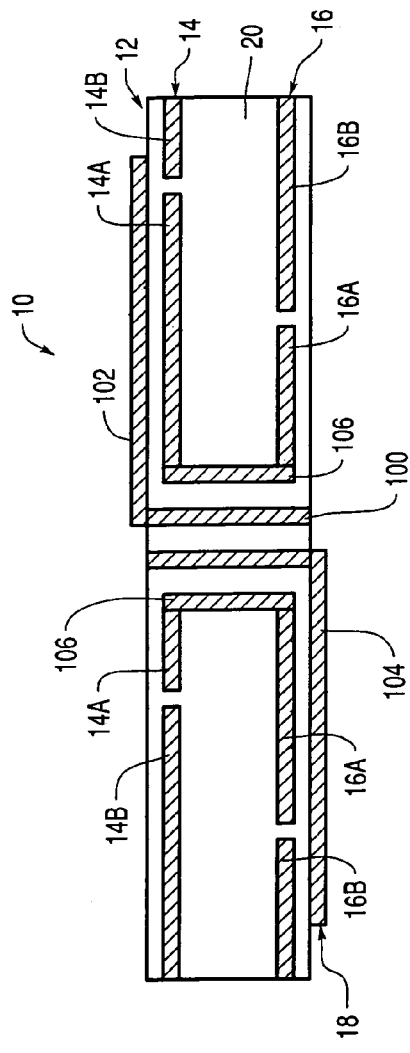
FIG. 3A is a cross-sectional view of the same printed circuit board along line A—A of FIG. 3B.
Figure 3B:
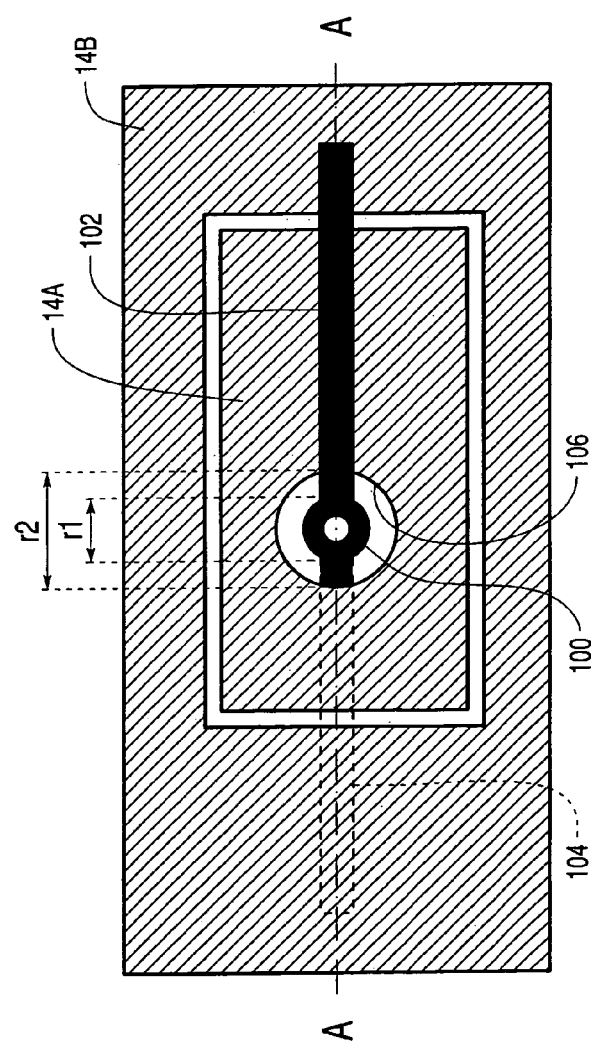
FIG. 3B is a schematic plan view of a printed circuit board according to a modified example of the first embodiment of the invention.

For example, as shown in FIGS. 3A and 3B, the first ground layer 14 may be configured by a power region 14A and a ground region 14B, and the second ground layer 16 may be configured by a power region 16A and a ground region 16B. In this case, the power region 14A of the first ground layer 14 and the power region 16A of the second ground layer 16 are connected by the second through hole 106.

Namely, other regions may be regions with any potential as long as the regions connected by the second through hole 106 are regions with the same potential.

Next, a second embodiment of the invention will be described. It should be noted that the same reference numerals will be given to portions that are identical to those of the first embodiment and that detailed description of those portions will be omitted.

FIG. 4A shows a schematic cross-sectional view of a printed circuit board 110 according to the present embodiment. FIG. 4B shows a plan view of the first ground layer 14. Also, FIG. 4A is a cross-sectional view along line A—A of FIG. 4B.

The printed circuit board 110 is different from the printed circuit board 10 shown in FIGS. 1A and 1B in that a dielectric member 112 is disposed between the first through hole 100 and the second through hole 106. Because the remaining portions are the same as those of the printed circuit board 10 shown in FIGS. 1A and 1B, description thereof will be omitted.

A common glass epoxy substrate, a high-speed-use glass ceramic or a glass cross substrate material that is an ultra-high-speed dielectric constant material can be used as the dielectric member 112.

As mentioned previously, the characteristic impedance Z relating to the first through hole 100 and the second through hole 106 is represented by the above equation (1). When the permeability μ, the outer diameter r1 of the first through hole 100 and the inner diameter r2 of the second through hole are constant, the characteristic impedance relating to the first through hole 100 and the second through hole 106 is dependent on the dielectric constant ε.

Thus, the dielectric member 112 is selected so that the characteristic impedance relating to the first through hole 100 and the second through hole 106 substantially matches the characteristic impedances predetermined from the input/output characteristics of the first signal wiring 102, the second signal wiring 104 and devices connected to these signal wirings.

For example, by lowering the dielectric constant, the characteristic impedance Z can be raised similar to reducing the outer diameter r1 of the first through hole 100 or enlarging the inner diameter r2 of the second through hole 106. Alternatively, by raising the dielectric constant, the characteristic impedance Z can be lowered similar to enlarging the outer diameter r1 of the first through hole 100 or reducing the inner diameter r2 of the second through hole 106.

In this manner, by adjusting the dielectric constant of the dielectric layer 112 between the first through hole 100 and the second through hole 106 so that the characteristic impedance relating to the first through hole 100 and the second through hole 106 matches the impedance of the signal transmission path, deterioration of signal quality resulting from signal reflection can be further suppressed, even with a signal of a GHz order.

As for the method of manufacturing the printed circuit board 10, it is possible to use the method described in, for example, JP-A 2001-203458.

The method of manufacturing the printed circuit board 10 is not limited to this method. The printed circuit board 10 can also be made by forming the first ground layer 14 and the second ground layer 16 sandwiching the insulating material 20, forming a first through hole with cutting means such as a drill or a laser, plating the first through hole, forming the second through hole 106 connecting the first ground layer 14 and the second ground layer 16, filling the second through hole 106 with the dielectric member 112, laminating a first prepreg layer and the first signal wiring layer 12 on the first ground layer 14 and laminating a second prepreg layer and the second signal wiring layer 18 on the second ground layer 16, forming a second through hole with the aforementioned cutting means in the region filled with the dielectric member 112, plating the second through hole, thereby forming the first through hole 100, and forming the first signal wiring 102 on the first signal wiring layer 12 and forming the second signal wiring 104 on the second signal wiring layer 18 so that the first signal wiring 102 and the second signal wiring 104 are connected to the first through hole 100.

In this manner, the printed circuit board 10 can be produced by a process not much different from the process for manufacturing a conventional multilayer printed circuit board, without a significant increase in cost.

Next, a third embodiment of the invention will be described. It should be noted that the same reference numerals will be given to portions that are identical to those of the preceding embodiments and that detailed description of those portions will be omitted.

FIG. 5 shows a schematic cross-sectional view of a printed circuit board 120 according to the present embodiment.

As shown in FIG. 5, the printed circuit board 120 includes a BGA (Ball Grid Array) type IC 122 mounted on the first signal wiring layer 12. A power wiring 126 to which power pins 124 of the IC 122 are connected is connected is to one end portion of the first through hole 100, and the other end portion of the first through hole 100 is connected to a power wiring 128 formed on the second signal wiring layer 18. Namely, power is supplied to the IC 122 via the first through hole 100 from the power wiring 128 formed on the second signal wiring layer 18. Additionally, the first through hole 100 is surrounded by the second through hole 106 of the ground potential.

Thus, a high-speed transient current can be stably supplied to the IC 122, whereby deterioration in power supply characteristics when the power is supplied crossing plural layers, which has conventionally been a problem, can be suppressed, and electromagnetic radiation can be suppressed.

As shown in FIG. 6, the printed circuit board can also have a configuration where the power is supplied to the power pins 124 of the IC 122 from the power wiring 126 formed on the first signal wiring layer 12 rather than being supplied from the second signal wiring layer 18 side, with a decoupling condenser 130 being disposed on the second signal wiring layer 18.

In this case, one end of the decoupling condenser 130 is connected to the power wiring 128 connected to the first through hole 100, and the other end of the decoupling condenser 130 is connected to a power wiring 134 connected to a third through hole 132.

The third through hole 132 is connected to the first ground layer 14 and the second ground layer 16 and has a ground potential. It should be noted that the power wiring 126 may also be disposed on the second signal wiring layer 18.

In this manner, by disposing the decoupling condenser 130, the supply characteristics of the transient current from the decoupling condenser 130 can be improved.

Figure 7:
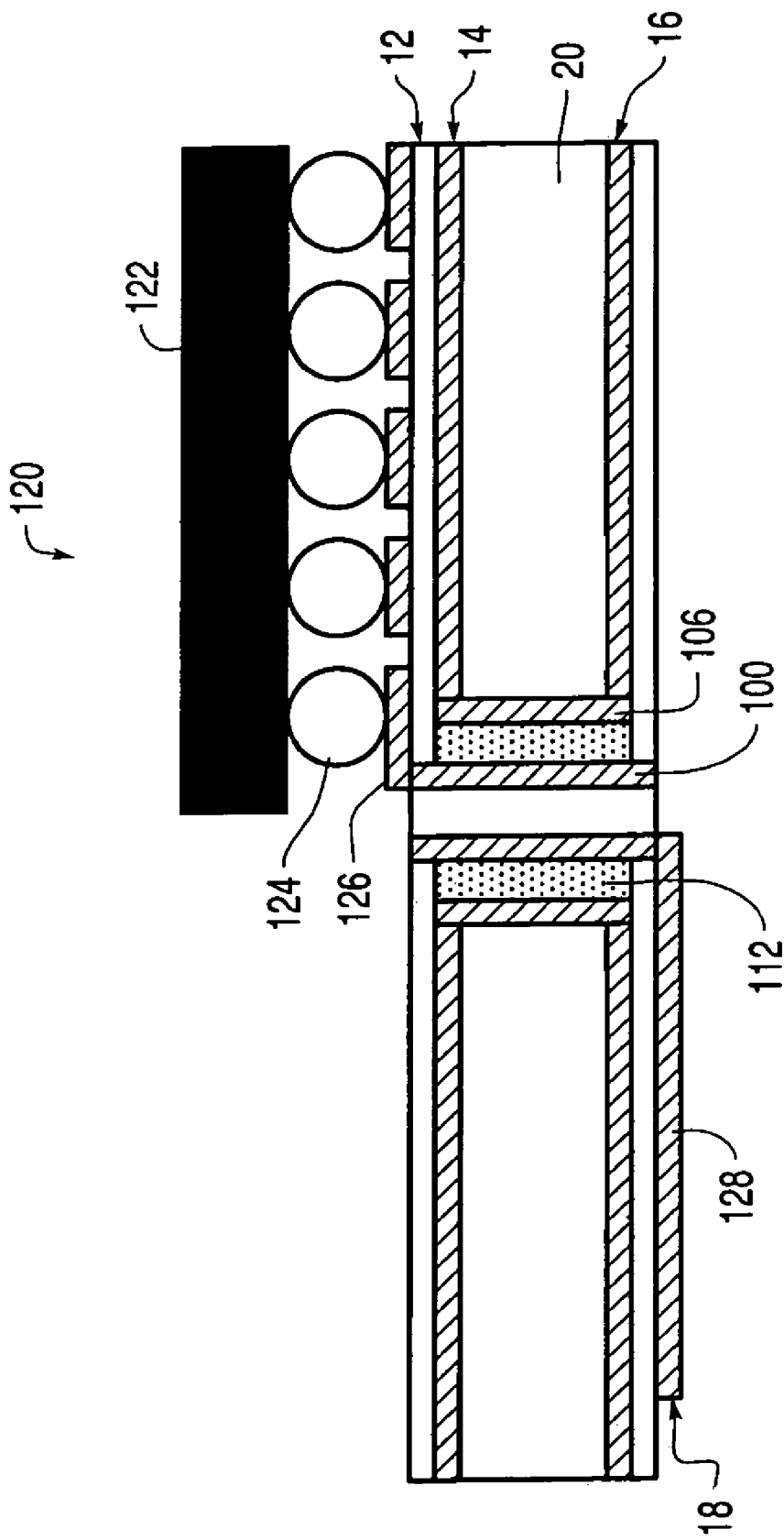
FIG. 7 is a cross-sectional view of a printed circuit board according to another modified example of the third embodiment.
Figure 8:
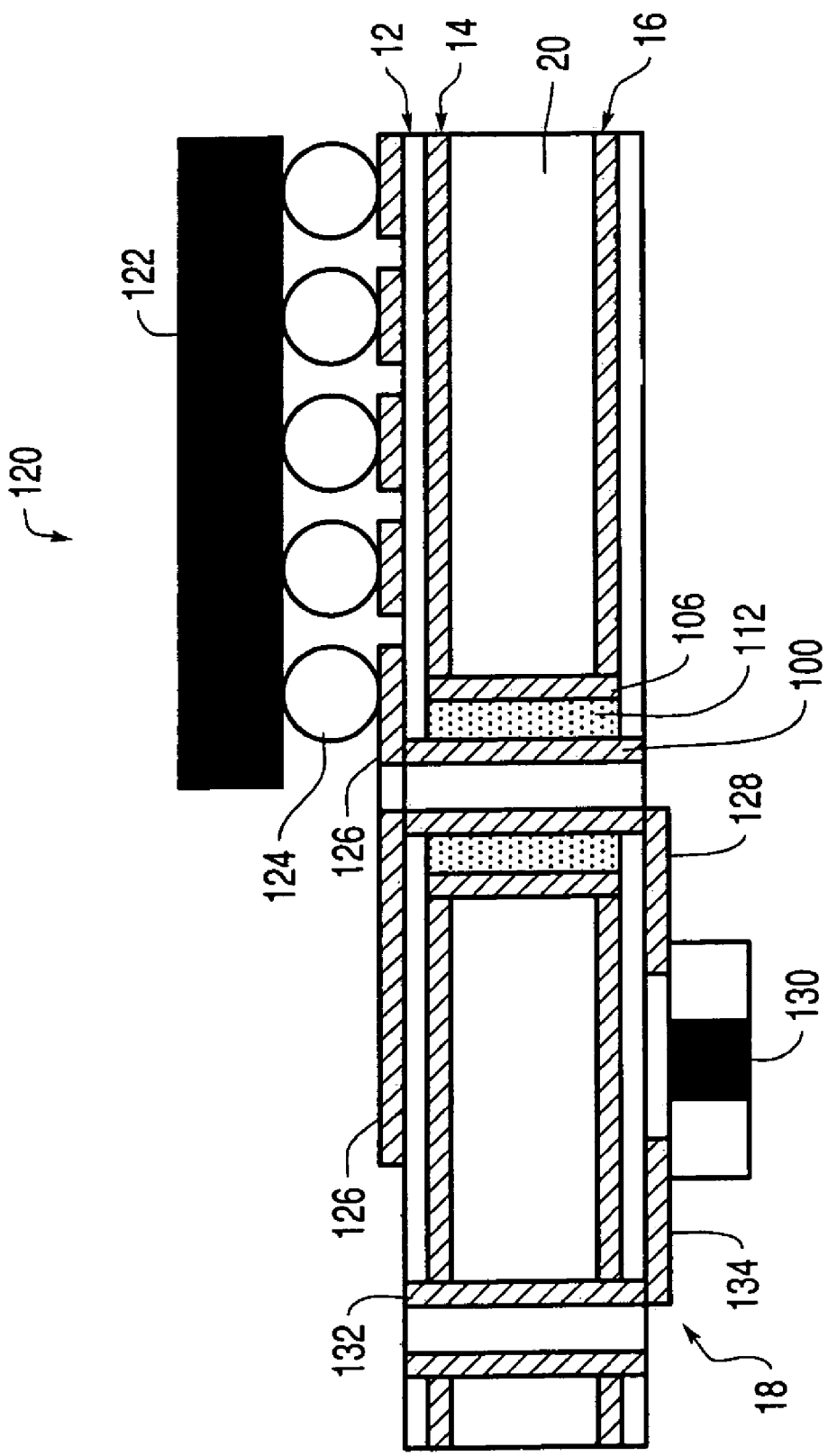
FIG. 8 is a cross-sectional view of a printed circuit board according to yet another modified example of the third embodiment.

As shown in FIGS. 7 and 8, the printed circuit boards of FIGS. 5 and 6 may also have a configuration where the dielectric member 112 is disposed between the first through hole 100 and the second through hole 106 similar to the printed circuit board 110 of FIGS. 4A and 4B.

By using a dielectric member with a high dielectric constant as the dielectric member 112, the transmission path of the coaxial structure comprising the first through hole 100 and the second through hole 106 becomes the supply path of a low-impedance high-speed transient current, and the transmission path itself of the coaxial structure has a capacitance that becomes the supply source of the high-speed transient current. Thus, the supply characteristics of the high-speed transient current can be improved and noise can be reduced.

In the present embodiment, a case was described where the BGA type IC 122 was mounted on the first signal wiring layer 12; however, the type of the IC is not limited to the BGA type. The IC may be of another type, such as a QFP (Quad Flat Package) type or a DIP (Dual Inline Package) type.

Figure 9:
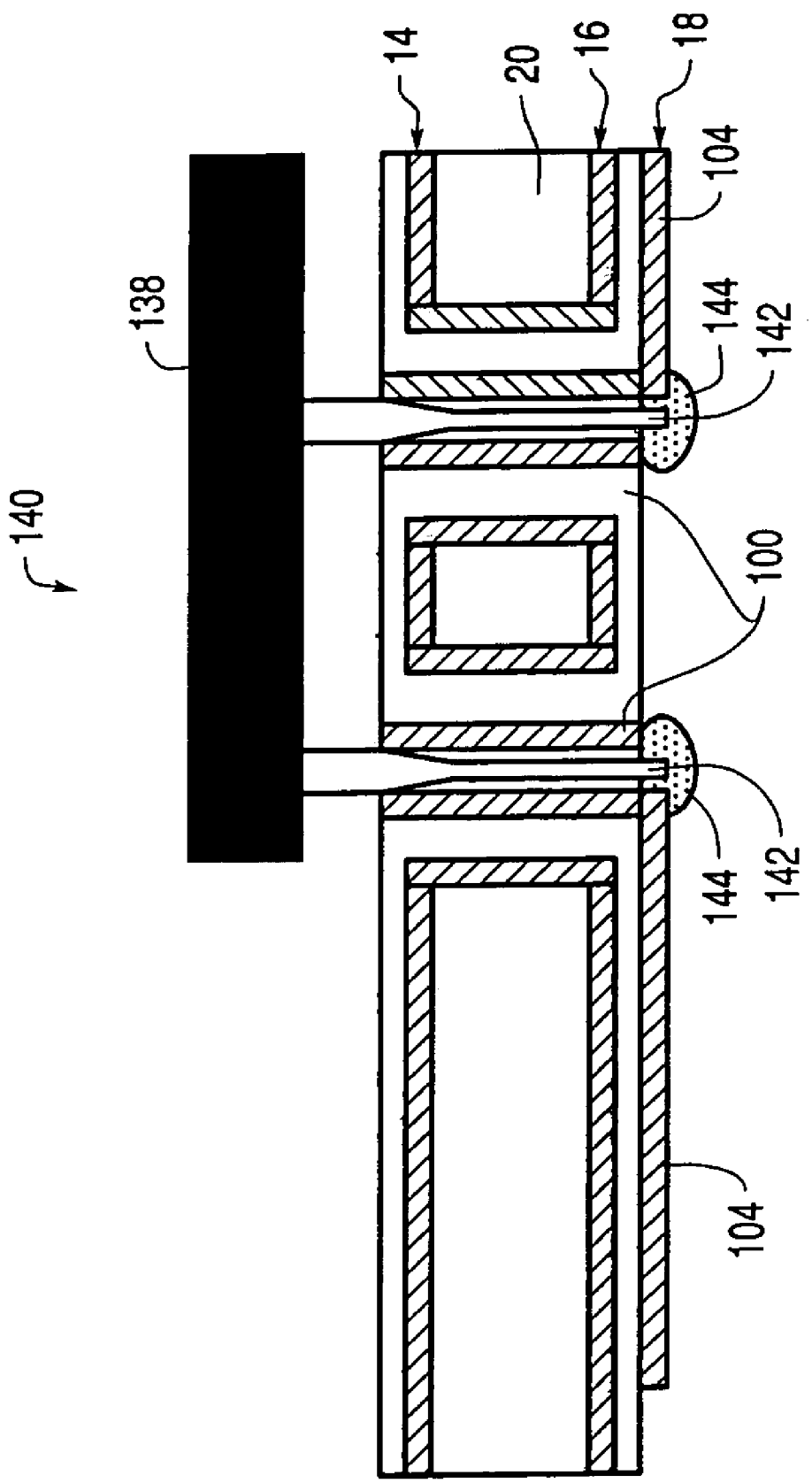
FIG. 9 is a cross-sectional view of a printed circuit board according to still another modified example of the third embodiment.

FIG. 9 shows a schematic cross-sectional view of a printed circuit board 140 where, for instance, a DIP type IC 138 is mounted on the first signal wring layer 12. In this case, as shown in FIG. 9, pins 142 of the IC 138 respectively penetrate the first through holes 100 and are bonded by, for example, solder 144, to the signal wiring 104 and the first through holes 100 at the second signal wiring layer 18.

In this case also, similar to the above, a high-speed transient current can be stably supplied to the IC 138, deterioration of the power supply characteristics can be suppressed, and electromagnetic radiation can be reduced.

Next, a fourth embodiment of the invention will be described. It should be noted that the same reference numerals will be given to portions that are identical to those of the preceding embodiments and that detailed description of those portions will be omitted. In the present embodiment, an embodiment of a printed circuit board in a case where a differential signal outputted from a differential signal driver is outputted from the first signal wiring layer 12 side to the second signal wiring layer 18 side will be described.

FIG. 10 shows a partial perspective view of a printed circuit board 150 according to the present embodiment. For ease of description, FIG. 10 shows only the first ground layer 14, the second ground layer 16, a differential signal driver 152 mounted on the first signal wiring layer 12, a pair of differential signal-use wirings 154A and 154B wired to the first signal wiring layer 12, a pair of first through holes 100A and 100B, the second through hole 106, and a pair of differential signal-use wirings 156A and 156B wired to the second signal wiring layer 18.

As shown in FIG. 10, the pair of differential signal-use wirings 154A and 154B wired to the first signal wiring layer 12 and the pair of differential signal-use wirings 156A and 156B wired to the second signal wiring layer 18 are respectively connected via the first through holes 100A and 100B. Additionally, the first through holes 100A and 100B are both disposed inside the second through hole 106. Namely, the printed circuit board 150 has a 2-core coaxial structure.

In this manner, the printed circuit board 150 has a structure where the first through holes 100A and 100B, through which a pair of differential signals flows, are both surrounded by the single second through hole 106. Thus, deterioration in signal quality in a case where the signals flow across plural layers, which has conventionally been a problem, can be suppressed.

Also, in the structure of the printed circuit board 150, a situation in which the common mode current, induced by common mode impedance becoming discontinuous, generates electromagnetic radiation, which would occur in the case where the first through holes 100A and 100B are separately surrounded by the second through holes, can be prevented.

Also, in the present embodiment, similar to the preceding embodiments, the differential impedance of the transmission path of the 2-core coaxial structure comprising the first through holes 100A and 100B and the second through hole 106, the differential impedance of the differential signal-use wirings 154A and 154B and the differential impedance of the differential signal-use wirings 156A and 156B can be substantially matched by adjusting the outer diameters of the first through holes 100A and 100B and the inner diameter of the second through hole 106.

Thus, deterioration in signal quality can be further suppressed.

It should be noted that the differential impedance becomes smaller the greater the distance between the first through holes 100A and 100B is, the differential impedance becomes smaller the larger the outer diameters of the first through holes 100A and 100B are, and the differential impedance becomes smaller the smaller the inner diameter of the second through hole 106 is.

Also, by adjusting the outer diameters of the first through holes 100A and 100B and the inner diameter of the second through hole 106, the common mode impedance that the first through holes 100A and 100B have with respect to the ground regions, the common mode impedance that the differential signal-use wirings 154A and 154B have with respect to the ground regions and the common mode impedance that the differential signal-use wirings 156A and 156B have with respect to the ground regions can be substantially matched.

Thus, electromagnetic radiation resulting from the common mode current induced by changes in the common mode impedance can be further suppressed from being generated.

It should be noted that, in a case where the differential impedance is constant, the common mode impedance becomes smaller the greater the distance of the first through holes 100A and 100B is. The common mode impedance becomes smaller the larger the outer diameters of the first through holes 100A and 100B are, and the common mode impedance becomes smaller the smaller the inner diameter of the second through hole 106 is.

Also, a dielectric member may be disposed between the first through holes 100A and 100B and the second through hole 106. By adjusting the dielectric constant of the dielectric member, the differential impedance and the common mode impedance in each transmission path can be substantially matched, similar to as described above.

Next, a fifth embodiment of the invention will be described. It should be noted that the same reference numerals will be given to portions that are identical to those of the preceding embodiments and that detailed description of those portions will be omitted.

FIG. 11A shows the printed circuit board 160 that comprises a 4-layer board of a multilayer structure where the first signal wiring layer 12, the first ground layer 14, the second ground layer 16 and the second signal wiring layer 18 are laminated via the insulating material 20.

FIG. 11B shows a plan view of the first ground layer 14. It should be noted that FIG. 11A is a cross-sectional view along line A—A of FIG. 11B.

As shown in FIGS. 11A and 11B, the first ground layer 14 and the second ground layer 16 are interlayer-connected by plural via holes 22. As shown in FIG. 11B, the via holes 22 are disposed at substantially equidistant intervals along the entire surface including the first ground layer 14. In this manner, because the first ground layer 14 and the second ground layer 16 are connected by the plural via holes 22, the two layers can be made to have substantially the same potential.

Also, as shown in FIGS. 11A and 11B, a ground pattern 24 and a linear first power wire 26 are formed separately and independently on the first ground layer 14. A ground pattern 28 and a linear second power wire 30 are formed separately and independently on the second ground layer 16.

Also, the power wire 26 and the power wire 30 are formed at inner sides from board end portions with the ground pattern 24 sandwiched therebetween.

The first power wire 26 and the second power wire 30 are interlayer-connected by a via hole 32. A positive terminal of a direct current voltage power source 34 mounted on the first signal wiring layer 12 is connected to the first power wire 26 through a via hole 35. A negative terminal of the direct current voltage power source 34 is connected to the ground pattern 24 through a via hole 37.

Thus, a predetermined direct current voltage Vcc is applied from the direct current voltage power source 34 to the first power wire 26 and the second power wire 30.

Also, ICs (e.g., digital ICs) 36, 38, 40 and 42, whose operating frequencies and signal frequencies are high frequencies (e.g., several GHz), are mounted on the first signal wiring layer 12. A power terminal 36V of the IC 36 is connected to the first power wire 26 through a connection pattern 44 and a via hole 46, and a ground terminal 36G of the IC 36 is connected to the first ground layer 14 through a via hole 48.

Thus, a direct current voltage Vcc is supplied from the first power wire 26 to the power terminal 36V, so that the IC 36 becomes operable.

A power terminal 38V of the IC 38 is connected to the second power wire 30 through a connection pattern 50 and a via hole 52, and a ground terminal 38G of the IC 38 is connected to the first ground layer 14 through a via hole 54. Thus, a direct current voltage Vcc is supplied from the second power wire 30 to the power terminal 38V, so that the IC 38 becomes operable.

A power terminal 40V of the IC 40 is connected to the first power wire 26 through a connection pattern 56 and a via hole 58, and a ground terminal 40G of the IC 40 is connected to the first ground layer 14 through a via hole 60. Thus, a direct current voltage Vcc is supplied from the first power wire 26 to the power terminal 40V, so that the IC 40 becomes operable.

A power terminal 42V of the IC 42 is connected to the second power wire 30 through a connection pattern 62 and a via hole 64, and a ground terminal 42G of the IC 42 is connected to the first ground layer 14 through a via hole 66. Thus, a direct current voltage Vcc is supplied from the second power wire 30 to the power terminal 42V, so that the IC 42 becomes operable.

Also, a signal terminal 36S1 of the IC 36 is connected to one end of a linear signal wiring 70 formed on the second signal wiring layer 18 via a first through hole 68. The other end of the signal wiring 70 is connected to a signal terminal 38S1 of the IC 38 via a first through hole 72.

The first through hole 68 is surrounded by a cylindrical second through hole 69 connected to the ground pattern 24 and the ground pattern 28. Similarly, the first through hole 72 is surrounded by a cylindrical second through hole 73 connected to the ground pattern 24 and the ground pattern 28.

For this reason, in a case where the signal flows across plural layers as in a case where, for example, the signal is outputted from the signal terminal 36S1 of the IC 36 to the signal terminal 38S1 of the IC 38 via the first through hole 68, the signal wiring 70 and the first through hole 72, the signal quality can reliably be prevented from deteriorating and electromagnetic radiation can reliably be suppressed.

A signal terminal 36S2 of the IC 36 is connected to one end of a linear signal wiring 76 formed on the second signal wiring layer 18 via a through hole 74. The other end of the signal wiring 76 is connected to a signal terminal 38S2 of the IC 38 via a through hole 78. Thus, the transmission and reception of signals between the IC 36 and IC 38 becomes possible.

Moreover, a signal terminal 40S1 of the IC 40 is connected to a signal terminal 42S1 of the IC 42 by a signal wiring 80, and a signal terminal 40S2 of the IC 40 is connected to a signal terminal 42S2 of the IC 42 by a signal wiring 82. Thus, the transmission and reception of signals between the IC 40 and the IC 42 becomes possible.

In this manner, in the printed circuit board 160, the first power wire 26 is formed in the first ground layer 14 and the second power wire 30 is formed in the second ground layer 16 (i.e., without a power layer opposing the first ground layer 14 and the second ground layer 16 being present). For this reason, electromagnetic radiation resulting from resonance between a power layer and ground layers is not generated. Also, because the power wires are disposed as inner layers, the packaging density of the signal wiring layers can be raised.

Next, examples of the invention will be described. FIG. 12 shows results where the relation between the attenuation and frequencies of the signals in the printed circuit board 10 described in the first embodiment and the conventional printed circuit board 200 of the conventional structure shown in FIGS. 14A and 14B is simulated with the FDTD (Finite Difference Time Domain) method.

Figure 13A:
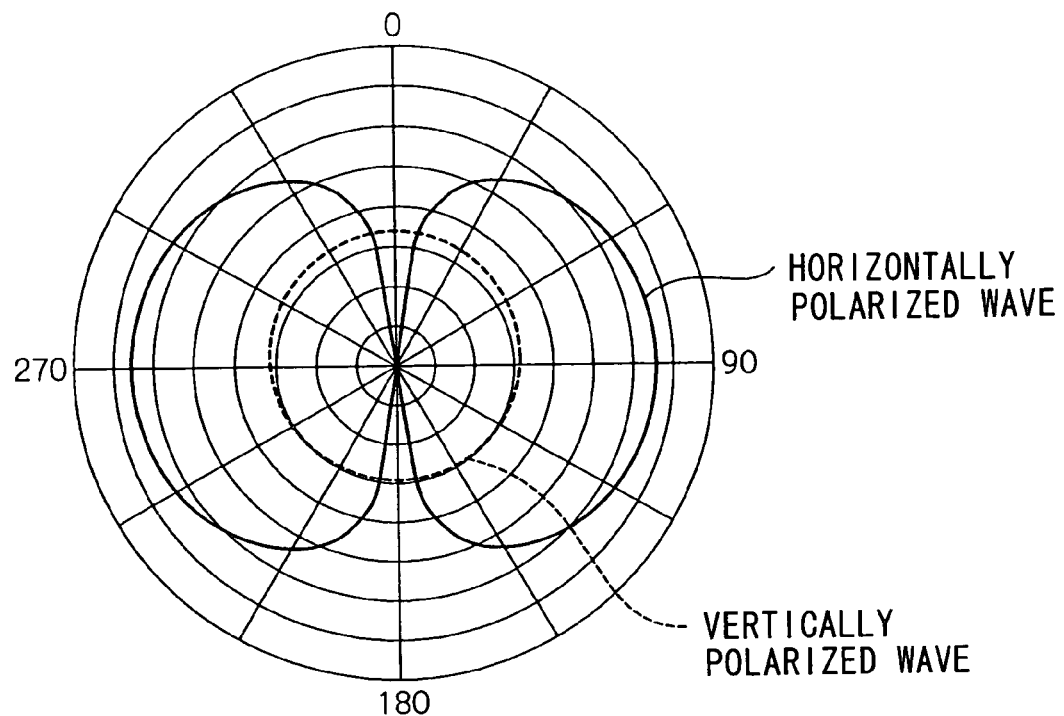
FIG. 13A is a drawing showing results where a distant electric field in a printed circuit board of a conventional structure was simulated.
Figure 13B:
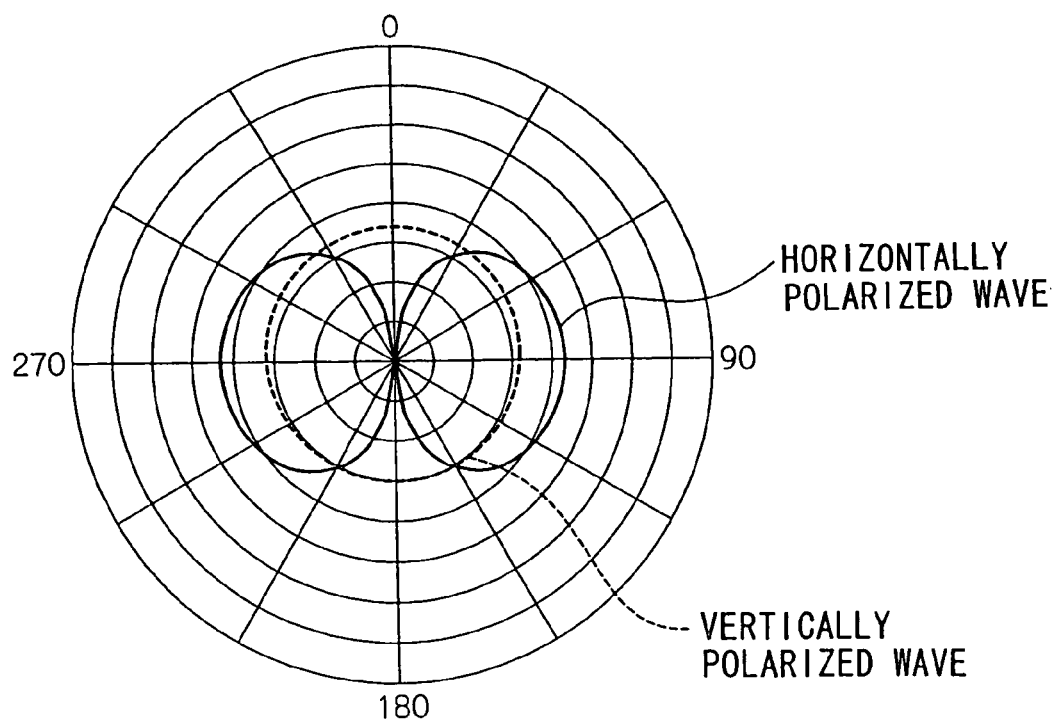
FIG. 13B is a drawing showing results where a distant electric field in the printed circuit board according to the invention is simulated.

FIG. 13A shows results where a distant electric field in the printed circuit board of the conventional structure shown in FIGS. 14A and 14B is simulated with the FDTD method. FIG. 13B shows results where a distant electric field in the printed circuit board 10 described in the first embodiment is simulated with the FDTD method.

With respect to the simulation conditions of the printed circuit board 10, the interval between the first ground layer 14 and the second ground layer 16 is 0.9 mm, the widths of the first signal wiring 102 on the first signal wiring layer 12 and the second signal wiring 104 of the second signal wiring layer 18 are 0.5 mm, and the interval between the signal wiring 102 and the first ground layer 14 and the interval between the signal wiring 104 and the second ground layer 16 are microstrip lines of 0.3 mm. Also, the outer diameter of the first through hole 100 is 0.5 mm, and the inner diameter of the second through hole 106 is 2 mm. The dielectric constants $\epsilon$ of the insulating materials 20 (the dielectric substrate) are all 4.7, and the metal portions of the wirings are all perfect conductors. The conditions of the other printed circuit boards are substantially the same.

In FIG. 12, "A" is the simulation result of the printed circuit board 200 shown in FIGS. 14A and 14B.

"B" is the simulation result of a printed circuit board where a via hole with the same diameter as that of the through hole 208 is disposed between the first ground layer and the second ground layer 16 at a position 1.75 mm away from the through hole 208 of the printed circuit board 200 shown in FIGS. 14A and 14B.

"C" is the simulation result of a printed circuit board of a structure where a single ground layer is sandwiched between the first signal wiring layer and the second signal wiring layer. It should be noted that the hole diameter of the through hole is 2 mm, the widths of the microstrip lines—i.e., the signal wiring formed on the first signal wiring layer and the signal wiring formed on the second signal wiring layer—are 0.5 mm, and the heights of the microstrip lines—i.e., the distance between the first signal wiring layer and the ground layer and the distance between the second signal wiring layer and the ground layer—are both 0.3 mm.

"D" is the simulation result in a case where the characteristic impedance of the signal wirings in the printed circuit board 10 described in the first embodiment and the characteristic impedance of the transmission path of the coaxial structure comprising the first through hole 100 and the second through hole 106 are not matched.

"E" is the simulation result of a case where, in the case of "D", matching of the impedances is conducted.

It should be noted that the simulations are conducted with the condition that the end portions of the ground layers and the wirings had Mur 1-order absorption barriers.

FIG. 12 shows the relation between the attenuation and frequencies of signals in cases where the signals flow from the first signal wiring layer to the second signal wiring layer through the through holes.

As shown in FIG. 12, in "A", the signal is attenuated by a maximum of about 1.4 dB with the frequency of the signal at 2 to 3 GHz, and thus when the signal travels back and forth through the two through holes, the attenuation reaches 2.8 dB, whereby one can say the printed circuit board is hardly practical for signal transmission of a GHz order.

"B" is improved in comparison to "A", but the improvement amounts to only about 0.2 dB.

In contrast, in "D", which is the simulation result of the printed circuit board 10 according to the present invention, the attenuation significantly decreases in comparison to "A" and "B", and in comparison to "C", which is the simulation result of the printed circuit board of the structure where there is a single ground layer and the return current is not cut off, it has substantially the same attenuation.

Moreover, it will be understood that in "E", which is the simulation result when matching of the impedances is conducted, the attenuation significantly decreases.

As a result of the analyses of the present inventors, it is understood that the attenuation of the signal in the printed circuit board of the conventional structure represented by "A" increases substantially in proportion to the interval between the two ground layers. Namely, although there arises no problem with a single ground layer, in the case where there are two ground layers, the attenuation of the signal changes due to the interval between the two ground layers.

In contrast, as is understood by the comparison with the simulation result of the printed circuit board provided with the single ground layer represented by "C", the printed circuit board according to the invention represented by "D" has excellent signal transmission characteristics regardless of the interval between the two ground layers.

Namely, when the interval between first signal wiring layer as an outer layer and the first ground layer, or the interval between the second signal wiring layer as an outer layer and the second ground layer, is reduced in order to lower the impedance of the signal wirings, one must enlarge the interval between the first ground layer and the second ground layer in a common printed board in order to avoid warp of the board and the affect of heat resulting from solder when the parts are mounted. However, in the printed circuit board according to the invention, there is no adverse affect on the signal transmission characteristics, and thus the printed circuit board of the invention is suited for high-speed transmission of a GHz order.

FIG. 13A shows results where, in the printed circuit board 200 of the conventional structure shown in FIGS. 14A and 14B, a horizontally polarized wave and a vertically polarized wave of a distant electric field are simulated to show changes in electromagnetic radiation in a case where the signal flows across plural layers.

FIG. 13B shows results where, in the printed circuit board 10 described in the first embodiment, a horizontally polarized wave and a vertically polarized wave of a distant electric field are simulated in the same manner as described above.

In both cases, the printed circuit board is horizontally disposed and a distant electric field of 1 GHz measured from a horizontal direction is simulated.

As shown in FIGS. 13A and 13B, it is understood that the electric field intensity of the horizontally polarized wave front is about 11 dB greater in the printed circuit board of the conventional structure than in the printed circuit board 10 according to the invention. This is because the horizontal-direction common mode current, generated by the return current being cut off when the signal flows across plural ground layers, dominantly affects the electromagnetic radiation.

It should be noted that in these simulations, in order to ensure that the calculation does not diverge, a Mur 1-order absorption barrier condition is used at the end portions of the two ground layers. Thus, in a case where the electric field resulting from the signal transmission-use via holes is coupled with the electric field between the power layer and the ground layer disposed as inner layers (i.e., in the case of a more realistic condition), the difference with the printed circuit board according to the invention becomes even greater.

As described in, for example, "Tasō purinto ban ni okeru bia haisen to fuyō fukusha to no kanren" (Denshi Jōhō Tsūshin Gakkai Sōgō Taikai, B-4-2 2002-3), this phenomenon occurs because electromagnetic radiation increases due to resonance between the ground layer and the power layer disposed as inner layers being induced by the high-frequency current flowing through the via holes.

However, such adverse affects do not in principle arise in the printed circuit board according to the invention.

Namely, according to the present invention, it becomes possible to suppress signal quality deterioration due to the through holes penetrating the plural ground layers and enables ultrahigh-speed transmission of a GHz order on the printed circuit board.

Similarly, further suppression of common mode noise is also possible, which contributes to low EMI. Also, in the present invention, it is not necessary to greatly change the structure of the printed circuit board itself from a common printed circuit board, parts for countering electromagnetic radiation can be reduced, and costs can be lowered.

It should be noted that the simulation results described above are truly applied not only to the transmission of signals but also to the transmission characteristics of a high-speed transient current of a power source.

As described above, the present invention has the effects that the invention is applicable to a printed circuit board operating at a high speed whose base clock is 1 GHz or greater, the invention can suppress electromagnetic radiation such as common mode radiation, and the invention can be configured at a low cost.

What is claimed is:

1. A printed circuit board comprising:
  a first wiring layer on which a first conductive wiring is formed;
  a second wiring layer on which a second conductive wiring is formed, wherein the first and second wiring layers are electrically non-conductive, and sides of the first and second wiring layers on which the first and second conductive wirings are respectively formed do not face each other;

a first conductive layer and a second conductive layer forming conductive regions are respectively laminated, with an insulating layer intervened therebetween, between the first wiring layer and the second wiring layer;

a conductive first interlayer connecting member that connects the first conductive wiring of the first wiring layer and the second conductive wiring of the second wiring layer; and a conductive second interlayer connecting member that is connected to the conductive regions of the first conductive layer and the second conductive layer, is isolated from the first interlayer connecting member and surrounds the first interlayer connecting member, wherein the first conductive layer and the second conductive layer respectively include plural conductive regions of different potentials, with the second interlayer connecting member connecting conductive regions of substantially the same potential of the first conductive layer and the second conductive layer.

2. The printed circuit board of claim 1, wherein the plural conductive regions include a power region and a ground region.

3. The printed circuit board of claim 1, wherein the first conductive wiring and the second conductive wiring are signal wires for signal transmission.

4. The printed circuit board of claim 1, wherein the first conductive wiring and the second conductive wiring are power wires for power supply.

5. The printed circuit board of claim 1, further comprising a pair of the first interlayer connecting members, wherein the first conductive wiring is configured by a pair of first differential signal wirings for differential signals, the 6. The printed circuit board of claim 1, wherein the second interlayer connecting member is formed by plural via holes.

7. The printed circuit board of claim 4, wherein a power terminal of an active device is connected to one of the first conductive wiring and the second conductive wiring, one end of a condenser is connected to the other of the first conductive wiring and the second conductive wiring, and the other end of the condenser is connected to a ground region disposed on at least one of the first conductive layer and the second conductive layer via third interlayer connecting member.

8. The printed circuit board of claim 4, wherein the dielectric constant between the first interlayer connecting member and the second interlayer connecting member is higher than the dielectric constant between the first conductive layer and the second conductive layer.

9. The printed circuit board of claim 4, further including a dielectric member between the first interlayer connecting member and the second interlayer connecting member, wherein the dielectric constant of the dielectric member is adjusted so that the characteristic impedance relating to the first interlayer connecting member and the second interlayer connecting member and the characteristic impedance relating to the wirings become substantially identical.

10. The printed circuit board of claim 5, wherein the differential impedances of the first interlayer connecting members are substantially identical to the differential impedances of the first differential signal wirings and the second differential signal wirings.

11. The printed circuit board of claim 5, wherein the common mode impedances of the pair of first interlayer connecting member with respect to the ground regions of the first conductive layer and the second conductive layer are substantially identical to at least one of the common mode impedances of the pair of first differential signal wirings with respect to the ground regions and the common mode impedances of the pair of second differential signal wirings with respect to the ground regions.

12. The printed circuit board of claim 7, further including a dielectric member between the first interlayer connecting member and the second interlayer connecting member, wherein the dielectric constant of the dielectric member is adjusted so that the 13. A printed circuit board comprising:

a first wiring layer on which a first conductive wiring is formed;

a second wiring layer on which a second conductive wiring is formed, wherein the first and second wiring layers are electrically non-conductive, and sides of the first and second wiring layers on which the first and second conductive wirings are respectively formed do not face each other;

a first conductive layer and a second conductive layer forming conductive regions are respectively laminated, with an insulating layer intervened therebetween, between the first wiring layer and the second wiring layer;

a conductive first interlayer connecting member that connects the first conductive wiring of the first wiring layer and the second conductive wiring of the second wiring layer; and a conductive second interlayer connecting member that is connected to the conductive regions of the first conductive layer and the second conductive layer, is isolated from the first interlayer connecting member and surrounds the first interlayer connecting member, wherein the characteristic impedance relating to the first interlayer connecting member and the second interlayer connecting member, the characteristic impedances of the first wiring and the characteristic impedances of the second wiring are substantially identical.

14. The printed circuit board of claim 13, wherein at least one of an outer diameter of the first interlayer connecting member and an inner diameter of the second interlayer connecting member is adjusted so that the characteristic impedance relating to the first interlayer connecting member and the second interlayer connecting member, the characteristic impedances of the first wiring and the characteristic impedances of the second wiring become substantially identical.

15. The printed circuit board of claim 13, further including a dielectric member between the first interlayer connecting member and the second interlayer connecting member, wherein the dielectric constant of the dielectric member is adjusted so that the characteristic impedance relating to the first interlayer connecting member and the second interlayer connecting member, the characteristic impedances of the first wiring and the characteristic impedances of the second wiring become substantially identical.

16. A printed circuit board where a wiring layer for forming a conductive wiring and a first conductive layer and a second conductive layer forming conductive regions are respectively laminated with an insulating layer intervened therebetween, the printed circuit board comprising:

a conductive first interlayer connecting member that is connected to the wiring of the wiring layer; and a conductive second interlayer connecting member that is connected to the conductive regions of the first conductive layer and the second conductive layer, is isolated from the first interlayer connecting member and surrounds the first interlayer connecting member, wherein
the first conductive layer and the second conductive layer respectively include plural conductive regions of different potentials, with the second interlayer connecting member connecting conductive regions of substantially the same potential of the first conductive layer and the second conductive layer.

17. The printed circuit board of claim 16, wherein a characteristic impedance of the first interlayer connecting member and the second interlayer connecting member is predetermined.

18. The printed circuit board of claim 17, wherein the plural conductive regions include a power region and a ground region.

* * * * *